United States Patent
Somers

(10) Patent No.: US 6,766,996 B1
(45) Date of Patent: Jul. 27, 2004

(54) MANIPULATOR

(75) Inventor: Richard Somers, St. George, UT (US)

(73) Assignee: Reid-Ashman Manufacturing, Inc., St. George, UT (US)

( * ) Notice: Subject to any disclaimer, the term of this patent is extended or adjusted under 35 U.S.C. 154(b) by 0 days.

(21) Appl. No.: 10/197,226

(22) Filed: Jul. 15, 2002

Related U.S. Application Data

(60) Provisional application No. 60/305,924, filed on Jul. 16, 2001.

(51) Int. Cl.[7] .............................................. F16M 13/00
(52) U.S. Cl. ............... 248/650; 248/123.11; 248/123.2; 248/669; 248/678; 414/589; 414/590
(58) Field of Search ................................. 248/650, 652, 248/664, 669, 676, 678, 671, 123.11, 123.2; 414/589, 590

(56) References Cited

U.S. PATENT DOCUMENTS

| | | | | |
|---|---|---|---|---|
| 3,575,368 A | * | 4/1971 | Thomas et al. ............. | 248/572 |
| 4,527,942 A | | 7/1985 | Smith .......................... | 414/590 |
| 4,588,346 A | | 5/1986 | Smith .......................... | 414/673 |
| 4,705,447 A | * | 11/1987 | Smith .......................... | 414/590 |
| 4,836,494 A | * | 6/1989 | Johnsen ....................... | 248/669 |
| 4,857,838 A | | 8/1989 | Willberg ...................... | 324/158 |
| 4,943,020 A | | 7/1990 | Beaucoup et al. ........... | 248/124 |
| 4,973,015 A | | 11/1990 | Beaucoup et al. ........... | 248/124 |
| 5,014,001 A | | 5/1991 | Schmidt et al. ............. | 324/158 |
| 5,030,869 A | | 7/1991 | Holt et al. ................... | 324/158 |
| 5,031,085 A | * | 7/1991 | Rustin ......................... | 362/401 |
| 5,078,021 A | | 1/1992 | Freywiss ..................... | 74/479 |
| 5,149,029 A | * | 9/1992 | Smith ........................ | 248/124.2 |
| 5,241,870 A | | 9/1993 | Holt ............................ | 73/866.5 |
| 5,316,260 A | * | 5/1994 | Johnston ..................... | 248/648 |
| 5,440,943 A | | 8/1995 | Holt et al. .................. | 74/89.15 |
| 5,450,766 A | | 9/1995 | Holt ............................ | 73/866.5 |
| 5,586,683 A | * | 12/1996 | Murakami ..................... | 221/33 |
| 5,600,258 A | | 2/1997 | Graham et al. ............. | 324/758 |
| 5,606,262 A | | 2/1997 | Montalbano et al. ....... | 324/758 |
| 5,831,442 A | | 11/1998 | Heigl .......................... | 324/754 |
| 5,900,737 A | | 5/1999 | Graham et al. ............. | 324/758 |
| 5,931,048 A | | 8/1999 | Slocum et al. ........... | 74/490.07 |
| 6,023,173 A | | 2/2000 | Khater et al. ............... | 324/758 |
| 6,057,695 A | | 5/2000 | Holt et al. ................... | 324/758 |
| 6,133,726 A | * | 10/2000 | Heigl ....................... | 324/158.1 |
| 6,166,552 A | | 12/2000 | O'Connell ................... | 324/754 |
| 6,396,257 B1 | | 5/2002 | Baum et al. ............. | 324/158.1 |
| 2002/0000819 A1 | | 1/2002 | Hollman ..................... | 324/758 |
| 2002/0003997 A1 | | 1/2002 | Orinski et al. .............. | 414/590 |

* cited by examiner

Primary Examiner—Ramon O. Ramirez
Assistant Examiner—Amy J. Sterling
(74) Attorney, Agent, or Firm—Thelen Reid & Priest LLP; Thierry K. Lo

(57) ABSTRACT

A manipulator for a test head comprises a base and a tower having vertical tracks. The tower is mounted on the base. A vertical shaft is mounted on the base adjacent to the tower. An outer carriage is in engagement with the vertical tracks. The outer carriage is movable relative to the tower along a vertical axis of the vertical tracks. The inner carriage is in engagement with the vertical shaft. The inner carriage is moveable relative to the tower along a vertical axis of the vertical shaft. A spring is disposed between the inner carriage and the outer carriage. The spring supports the outer carriage. An arm is coupled to the outer carriage. The arm is adapted for supporting the test head.

16 Claims, 9 Drawing Sheets

MANIPULATOR

CROSS-REFERENCES

The present application claims the benefit of U.S. Provisional Patent Application Serial No. 60/305,924, filed Jul. 16, 2001 in the name of inventor Richard Somers and commonly assigned herewith.

FIELD OF THE INVENTION

The present invention relates to a manipulator. More particularly, the present invention relates to a manipulator for supporting and orienting the test head of an automatic test system.

BACKGROUND OF THE INVENTION

Manufacturers of semiconductor chips use automatic test equipment. Semiconductor chips are tested as early as possible in the manufacturing process to avoid the cost of processing defective chips. Generally, the chips are tested while they are still part of the semiconductor wafer on which they are fabricated. To test chips in this form, probes must be placed directly onto the chip because leads through which the chip is normally accessed are not added until the chips are separated from the wafer and packaged.

The probes are attached to a portion of the automatic test equipment called a "test head." The test head is connected through a cable to a mainframe cabinet, which holds a major portion of the electronic circuitry needed to generate and analyze test signals. The test head is supported by a manipulator, which allows the test head to be moved.

To test a chip, the wafer is mounted in a device called a prober. The test head is then moved by a human operator to bring the probes into contact with the chip. The test head is secured in this position, and testing is performed. The process of moving and securing the test head in a position in which electrical contact can be made to the chip is called "docking." Once docked, the prober moves the wafer around to present different chips on the wafer for testing.

Various factors make the docking process extremely difficult. First, the semiconductor chip is very small, on the order of a fraction of a square inch. Hundreds of test signals must often be coupled to the chip. The contact points for these test signals must all fit onto the small chip, requiring them to be very small. The test head must be precisely positioned so that all of the probes line up with all of the contact points.

Achieving precise positioning of the test head is complicated because the test head can weigh hundreds of pounds. The weight is largely caused by the need to position some electronic circuitry as close as possible to the chip being tested. The weight makes it difficult to move the test head. In addition, the test head can put excessive force on the prober, causing the prober to deform. If the prober deforms too much, it is very difficult to achieve precise positioning of the probes relative to the chip in the prober.

A further complicating factor is that the cable connecting the test head to the mainframe cabinet is very heavy and exhibits hysteresis. A cable can weigh hundreds of pounds. The cable weight can create forces on the test head. Because the cable exhibits hysteresis, these forces can change when the cable is moved. Thus, the manipulator must precisely position the test head despite the changing forces.

A further complicating factor is that different probers are often used with the same automatic test equipment. Different probers hold the semiconductor chip in different configurations. The manipulator must be able to position the test head to dock regardless of the type of prober used. Sometimes the test head is positioned horizontally above the prober with the probes facing down. In other instances it is positioned horizontally below the prober with the probes facing up. For other probers, the test head is positioned vertically with the probes facing sideways. Still other probers require the test head to be positioned at some angle between horizontal and vertical.

Various design techniques have been employed to facilitate docking. High precision manufacturing techniques are employed to ensure there is as little slack as possible in the manipulator. Hard stops are built into the manipulator to help it return repeatedly to the same position. Also, the contact area between the prober and the test head is made as large as possible to average out any deflections.

To make positioning easier and to reduce deflection caused by the weight of the test heads, counter weight schemes have been proposed. Also to ameliorate problems caused by the weight of the test head, some manipulators include motors or other drive mechanisms. To reduce the effect of the weight of the cable, arrangements have been proposed to support the weight of the cable.

Despite use of these design techniques, current manipulators can not always easily dock a test head with a prober. Often, two people are needed to handle the test head to get it into position. When the test head appears to be docked, numerous adjustments are sometimes needed to make electrical contact to all of the test points on the integrated circuit chip.

BRIEF DESCRIPTION OF THE INVENTION

A manipulator for a test head comprises a base and a tower having vertical tracks. The tower is mounted on the base. A vertical shaft is mounted on the base adjacent to the tower. An outer carriage is in engagement with the vertical tracks. The outer carriage is movable relative to the tower along a vertical axis of the vertical tracks. The inner carriage is in engagement with the vertical shaft. The inner carriage is moveable relative to the tower along a vertical axis of the vertical shaft. A spring is disposed between the inner carriage an outer carriage. The spring supports the outer carriage. An arm is coupled to the outer carriage. The arm is adapted for supporting the test head.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of a manipulator. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application-and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1A:
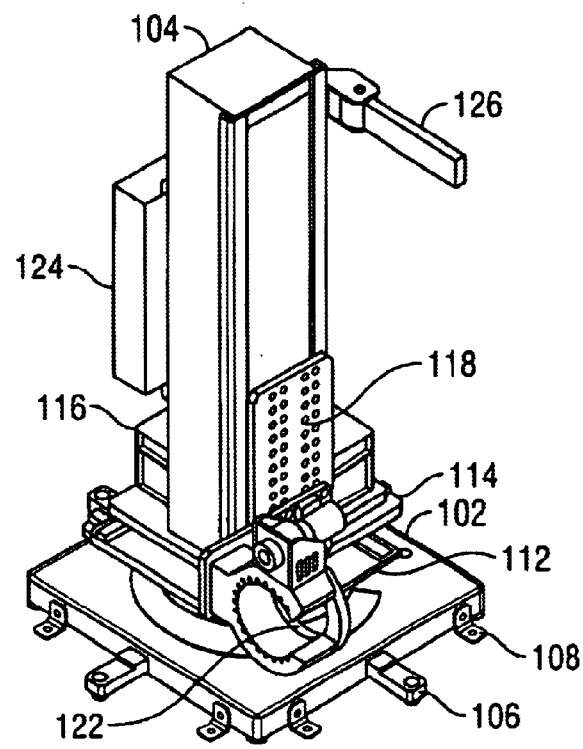
FIG. 1A is a perspective view of a manipulator for supporting and orienting a test head in accordance with one specific embodiment of the present invention.

The manipulator may be used to hold and position a test head to facilitate docking to a prober or a handler. The manipulator may hold several thousand pounds, for example 5000 pounds. Many traditional manipulators have moving counterweights. The counterweight offsets the gravity load of the test head, provides for vertical motion compliance, and provides stability so the manipulator does not tip over. In accordance with one specific embodiment of the present invention, a manipulator may comprise a non-moving counterweight with a separate vertical compliant drive for the vertical motion compliance. This allows for design and manufacturing flexibility in configuring the manipulator for different weights of test heads and different heights of columns. FIG. 1A illustrates a counterweight having a symmetric shape wrapped around the side and back of a column structure. The counterweight may comprise lead filled steel shell in 500, 1000, and 2000 pound increments. The vertical compliant drive is described in more detail below.

Figure 1B:
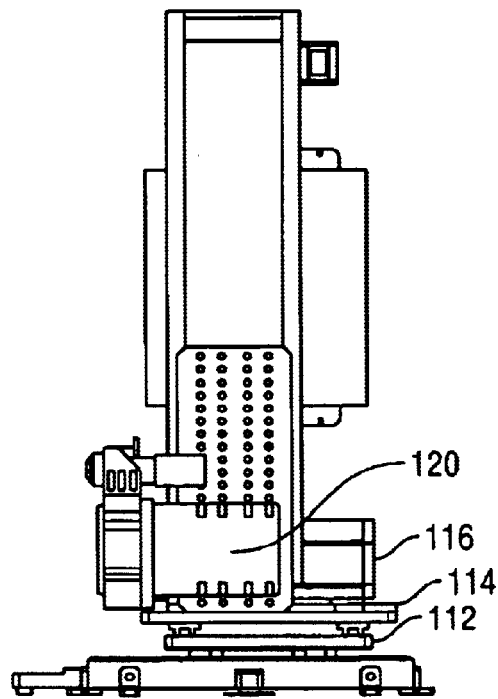
FIG. 1B is a frontal view of a manipulator for supporting and orienting a test head in accordance with one specific embodiment of the present invention.
Figure 1C:
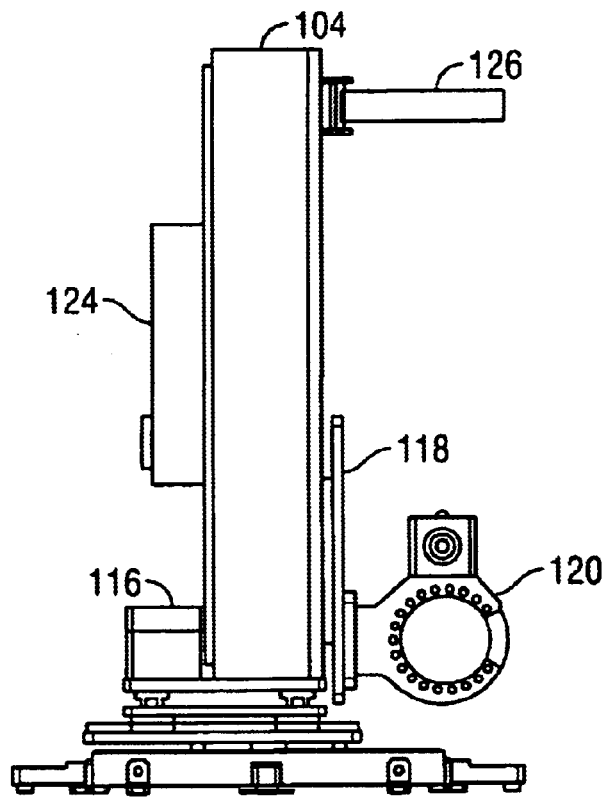
FIG. 1C is a side view of a manipulator for supporting and orienting a test head in accordance with one specific embodiment of the present invention.
Figure 1D:
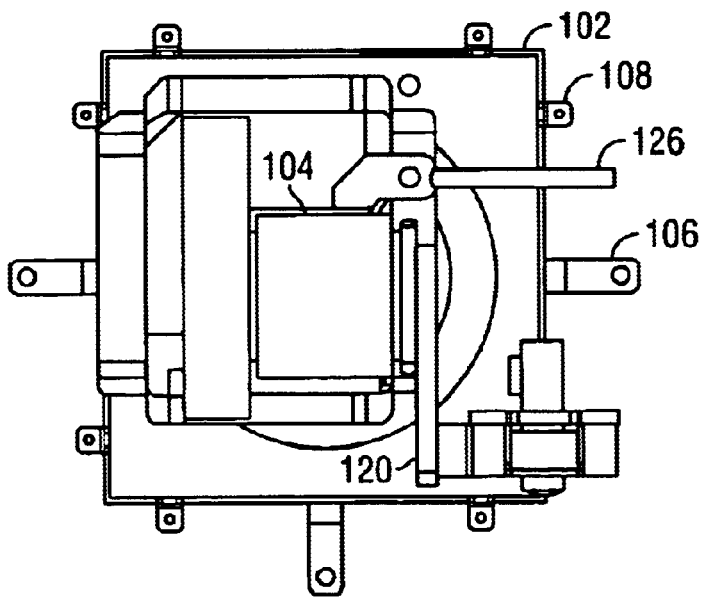
FIG. 1D is a top view of a manipulator for supporting and orienting a test head in accordance with one specific embodiment of the present invention.

FIG. 1A is a perspective view of a manipulator for a test head in accordance with one specific embodiment of the present invention. FIGS. 1B, 1C, and 1D provide additional view of the manipulator. A base 102 supports a vertical structure, or column 104. The base 102 may have a shape of a block having for example, a length of about 52 inches on each side. The base 102 may also have several legs 106 on each side for more stabilization and support. Hinges 108 on every side may also provide added stability to the base 102. The base 102 may further comprise a rotational guide 110 for securing the position of the column 104. The rotational guide 110 is described in more detail below.

Horizontal plates 112 and 114 provide additional degrees of freedom to the column 104. In particular, both horizontal plates 112 and 114 provide movement in an "X-Y" plane that is parallel to the base 102. The base 102 is described in more detail in FIGS. 3A and 3B further below. The column 104 is coupled to the top of the horizontal plate 114. A counterweight 116 is disposed on the top of the horizontal plate 114 adjacent to the column 104. The weight of counterweight 116 may be adjusted as needed to counter balance the weight of a test head supported by the column 104. FIG. 1A illustrates an "L" shaped counterweight adjacent against two sides of the column 104. The height of the counterweight pieces may be for example about 10 inches high.

The height of the column 104 may be for example 88 inches. Other heights may be utilized as required by the dimensions of the test head. The column 104 may comprise a C shaped capped at each end, the top end being the top of the column 104. Therefore, the column 104 may have three sided walls. The side having the opening sits on the edge of the top horizontal plate 114. A vertical rotating screw (not shown) within the column 104 is coupled to a carriage (not shown) within the column. One side of the carriage adjacent to the side of the column having the opening is coupled to a vertical force module mount 118. The vertical force module mount 118 may be a plate having several cavities for coupling with an arm 120. The test head arm 120 may also comprise a test head mount in a shape of a C clip 122. A control and power box 124 may be attached to a side of the column 104 opposite to the side having the opening. A cable support arm 126 may be attached to the column 104 near its top.

Figure 2A:
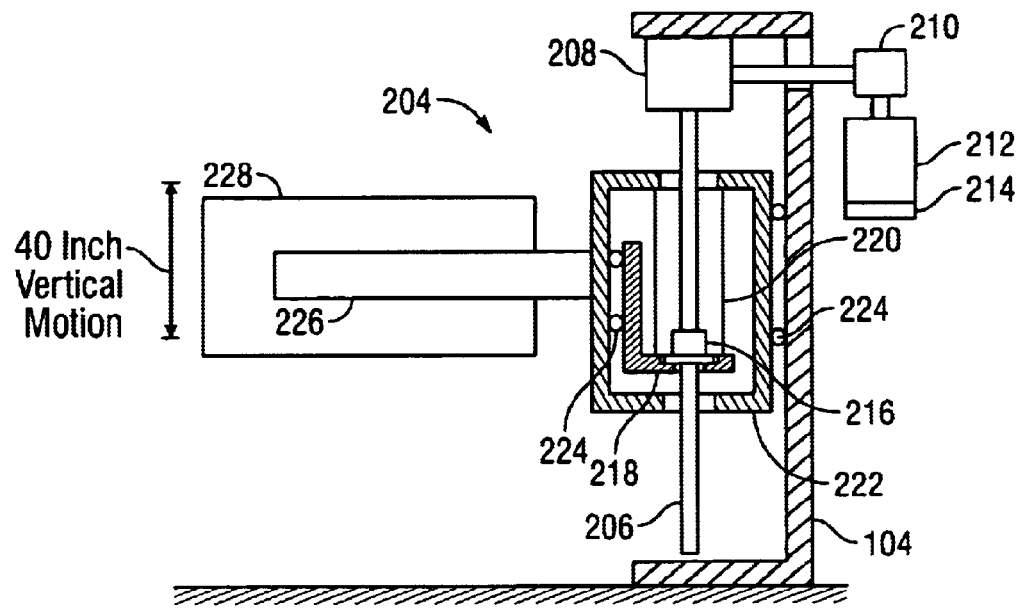
FIG. 2A is a schematic diagram illustrating an elevation sectional view of the manipulator in accordance with one specific embodiment of the present invention.

FIG. 2A is a schematic diagram illustrating an elevation sectional view of the manipulator in accordance with one specific embodiment of the present invention. A column structure 202 sits on a base (not shown). The column structure 202 may be hollow to accommodate a vertical compliant drive system 204. In accordance with one specific embodiment of the present invention, the vertical column structure 202 is an open "C" shaped channel capped at each end. The vertical compliant drive system 204 comprises a vertical shaft such as a vertical rotating screw 206 having a length substantially similar to the height of the column structure 202. The vertical rotating screw is disposed within the column structure 202 and coupled a ceiling within the column structure 202 with a screw jack with integral gear 208. In accordance with one specific embodiment of the present invention, the screw jack 208 is coupled to a right angle gear 210 powered by a motor 212 having a brake system 214. Both the right angle gear 210 and the motor 212 resides outside the column structure 202.

A traveling nut 216 is coupled to the rotating screw 206 allowing the nut 216 to travel up or down vertically whenever rotating screw 206 rotates. The traveling nut 216 is coupled to an inner carriage 218. A spring 220 sits on the inner carriage 218 and supports a ceiling of an outer carriage 222. The spring 220 may have the same vertical axis as the rotating screw 206. In accordance with one specific embodiment of the present invention, the spring 220 is a coil forming a helix with its axis aligned with the axis of the rotating screw 206. The outer carriage 222 encloses the spring 220, the inner carriage 218, the traveling nut 216, and a portion of the rotating screw 206. In accordance with one specific embodiment of the present invention, the outer carriage 222 has an opening on its top and bottom allowing the outer carriage 222 to loosely slide through along a vertical axis of the rotating screw 206. The inner carriage 218 may move against the inner walls of the outer carriage 222 through linear bearings 224 disposed between the inner walls of the outer carriage 222 and the outer walls of the inner carriage 218. FIG. 5 illustrates in more details the structure of the vertical compliant drive.

The outer side wall of the outer carriage 222 adjacent to the column structure 202 may move against the inner wall of the column structure 202 using also vertical bearings 224. The bearings may be located at an inside back face of the column structure 202. In accordance with one specific embodiment, the column structure 202 may comprise one or more vertical tracks attached to the inside back face of the column structure 202. The vertical tracks are in engagement with the outer side wall of outer carriage 222 supporting the outer carriage 222. Thus the outer carriage 222 may slide up or down along the vertical tracks of the column structure 202. One of ordinary skill will recognize that there are many other ways to couple the outer carriage to the column structure in such a way to allow to support the outer carriage as well as allowing the outer carriage to solely move up or down. FIG. 5 illustrates in more detail the inner and outer carriages.

For example, in an upward driving mode, as the screw 206 rotates, the inner carriage 218 is driven upward. The spring 220 is compressed so that the spring forces the outer carriage 222 to move upward. In a compliant mode, the vertical compliant drive system 204 required for docking a test head may be provided through the large spring 220 inside the carriage (inner and outer carriage) arrangement. The compliance of the spring is optimized based on the vertical drag force in the bearings, head weight, and space available. In particular, the spring 220 should not be too stiff, otherwise creating very little compliance. The spring 220 should not be too soft, otherwise creating too much compliance and thus a lack positioning accuracy. The spring 220 should also be strong enough to support the weight of the test head. Therefore test heads may be matched with specific springs.

The carriages ride in a vertical motion inside the column structure 202. An extending horizontal arm 226 is coupled to the outer carriage. The arm 226 supports a test head 228.

Figure 2B:
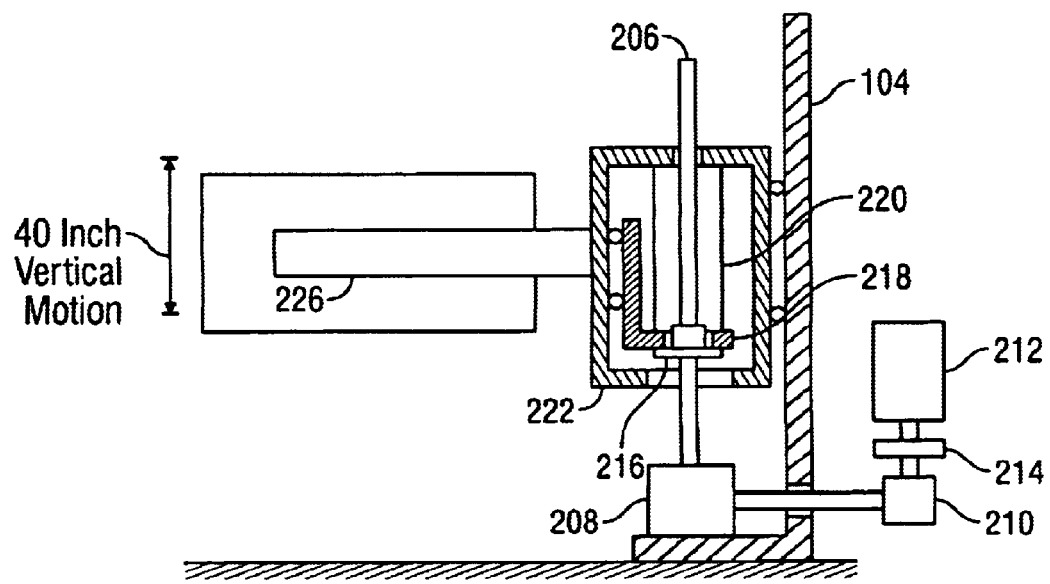
FIG. 2B is a schematic diagram illustrating an elevation sectional view of the manipulator in accordance with another specific embodiment of the present invention.

FIG. 2B is a schematic diagram illustrating an elevation sectional view of the manipulator in accordance with another specific embodiment of the present invention. In contrast to FIG. 2A, the rotating screw in FIG. 2B is coupled with the vertical column structure 202 instead at its bottom plate.

Figure 3A:
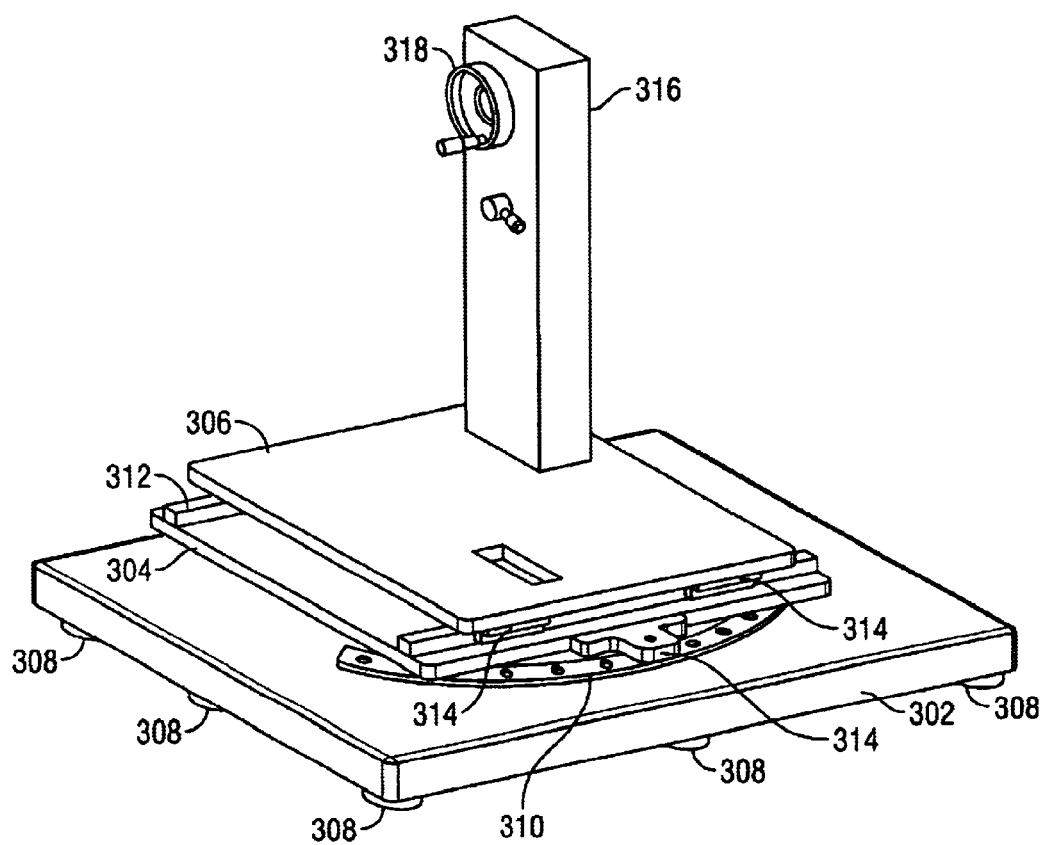
FIG. 3A is a perspective view of a base in accordance with one specific embodiment of the present invention.

FIG. 3A is a perspective view of a base in accordance with one specific embodiment of the present invention. The column of FIG. 1 may be supported at its bottom by a base assembly 300 having a base 302, a first plate 304, and a second plate 306. The base 302 may have several adjustable legs 308 resting on a floor for leveling off the base 302. A positioning guide 310 in the shape of an arc of circle is attached on the top surface of the base 302. The positioning guide 310 comprises several evenly spaced cavities defining specific positions.

The first plate 304 comprises a couple of horizontal guiding rails 312 on its top surface and a guide 314 on side. The first plate 304 may rotate about a vertical axis about the center of the base 302. The positioning guide 310 secures the rotational position of the base 302 at a specific position using pins (not shown) to be inserted through the guide 314 and a cavity on the positioning guide 310.

The horizontal guiding rails 312 define the range of motion of the second plate 306 in engagement with the horizontal guiding rails 312. The second plate 306 may have a couple of guides 314 in engagement with each horizontal guiding rail 312. The guides 314 allow the second plate 306 to move along a horizontal axis defined by the horizontal guiding rails 312. A column structure 316 sits on the second plate 306. A rotating handle 318 may be attached to the column structure 316. The rotating handle 318 may control the horizontal movement of the second plate along the axis of the horizontal guiding rails 312. The movement of the second plate may be motorized using other means such as an electrical drive. Thus the base illustrated in FIG. 3A allows rotational movement about a vertical axis and a horizontal movement about a horizontal axis.

Figure 3B:
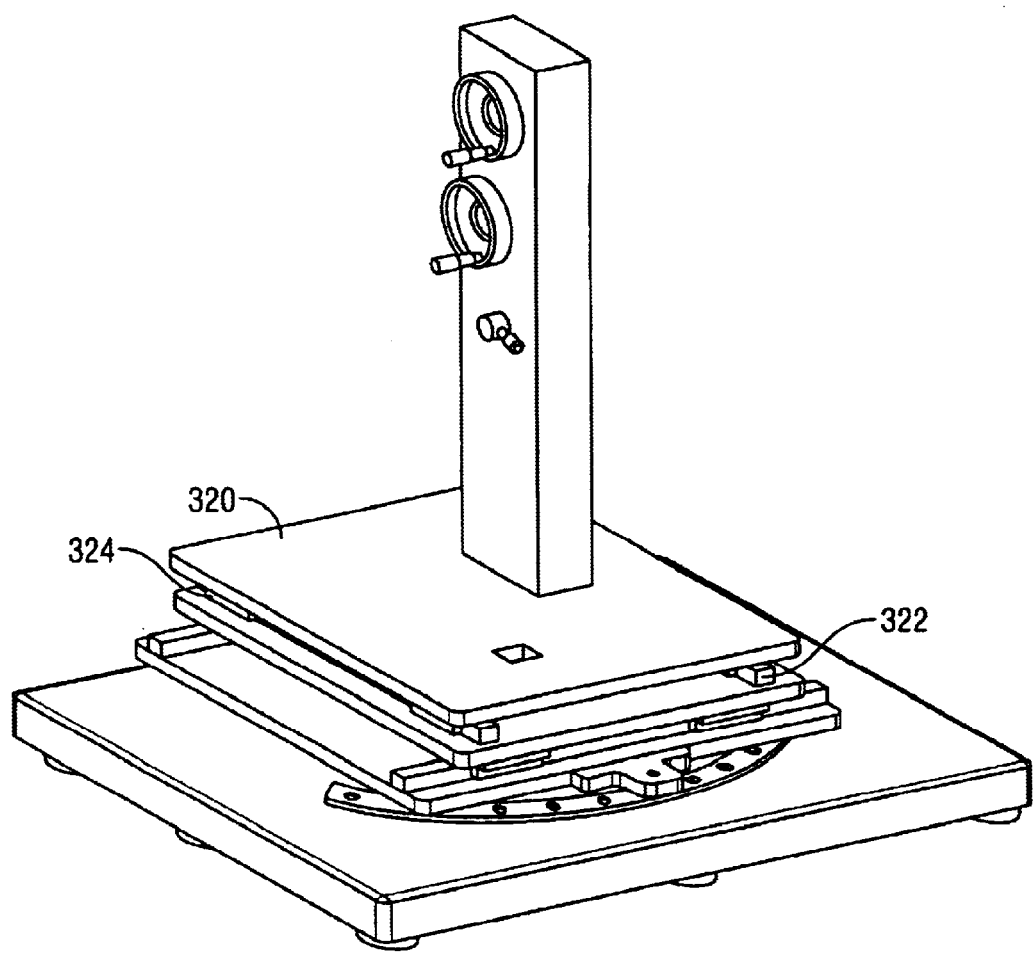
FIG. 3B is a perspective view of a base in accordance with another specific embodiment of the present invention.

FIG. 3B is a perspective view of a base in accordance with another specific embodiment of the present invention. To add further degrees of freedom to the base, a third plate 320 may be added on top of the second plate 306. The third plate 320 is coupled to the second plate 306 through a second pair of guiding rails 322 that are perpendicular to the horizontal axis of the first pair of guiding rails 312. The guiding rails similarly support guides 324 attached underneath the third plate 320. A second handle 326 allow control of the movement of the third plate 320 along a horizontal axis of the second pair of guiding rails 324. Those of ordinary skill will recognize that many other ways exist to build a base allow many degrees of freedom.

Figure 4:
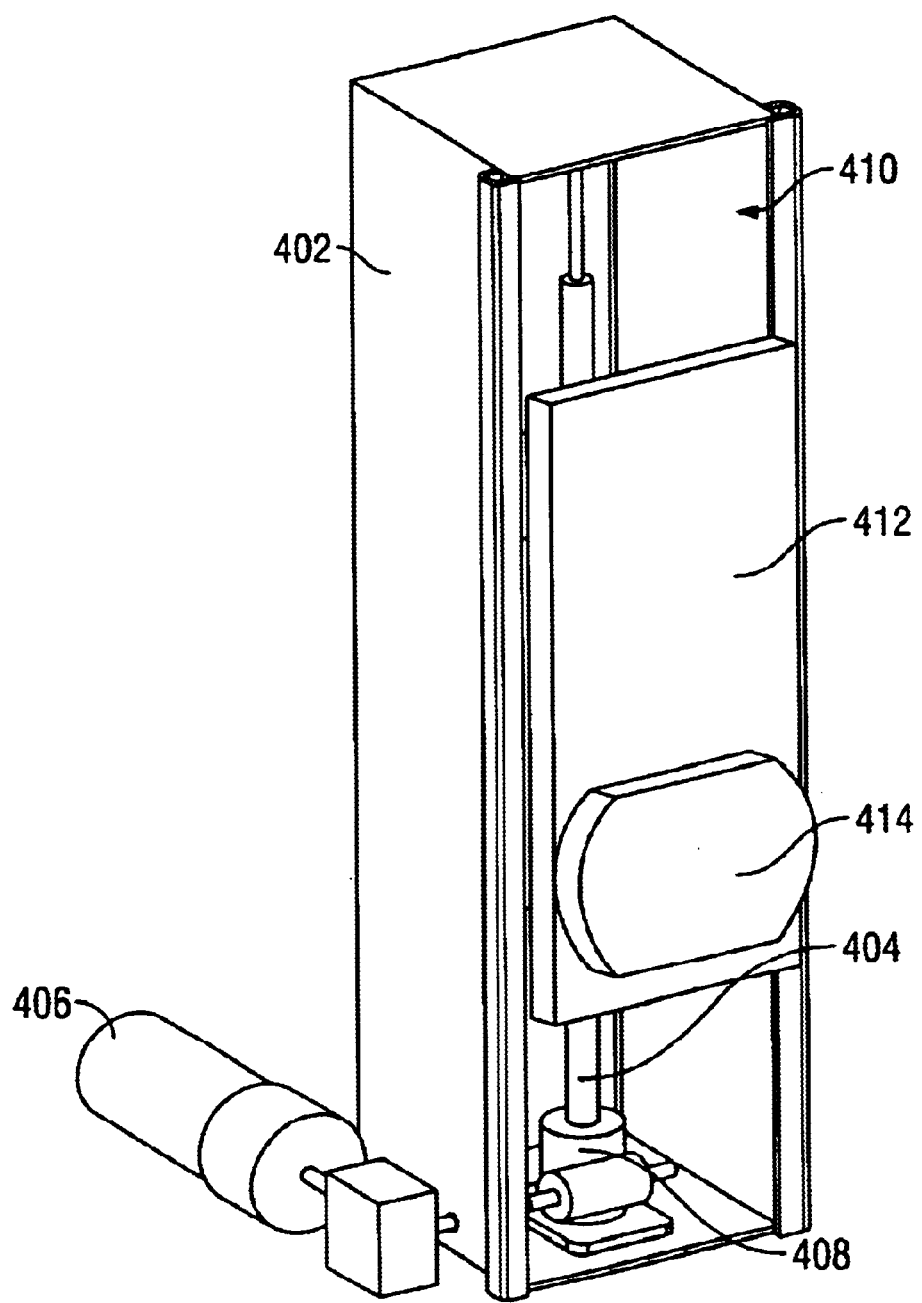
FIG. 4 is a perspective view of a column assembly in accordance with one specific embodiment of the present invention.

FIG. 4 is a perspective view of a column assembly in accordance with one specific embodiment of the present invention. A hollow tower structure 402 may include a frontal opening. In accordance with one specific embodiment of the present invention, the tower structure 402 may be an open "C" shaped channel capped at each end. The tower structure 402 may also have a back plate doubler, edge stiffeners, heavy wall material, and a double lap joint welded bottom. A vertical rotating screw 404 is disposed within the walls of the tower structure at its base. A motor 406 is engaged with a gear 408 at the bottom of the vertical rotating screw 404 controlling the rotation of the vertical rotating screw 404. The tower structure includes an opening 410 on one side of its wall. The opening 410 allows a carriage 412 to engage with the vertical rotating screw 404 and slide vertically along the open face 410 of the tower structure 402. The carriage 412 may comprise a front place 414 on which an arm supporting a test head may be attached to. The front plate 414 may be highly modular allowing for multiple mounting positions of the vertical force module (described further below). The engagement between the carriage 412 and the vertical rotating screw 404 is explained in more detail in FIG. 5. In accordance with another embodiment of the present invention, the vertical rotating screw 404 may be attached to a ceiling within the tower structure 402 as illustrated in FIG. 2A. One of ordinary skill in the art will recognize that there are many other ways to rotate the vertical screw 404.

Figure 5A:
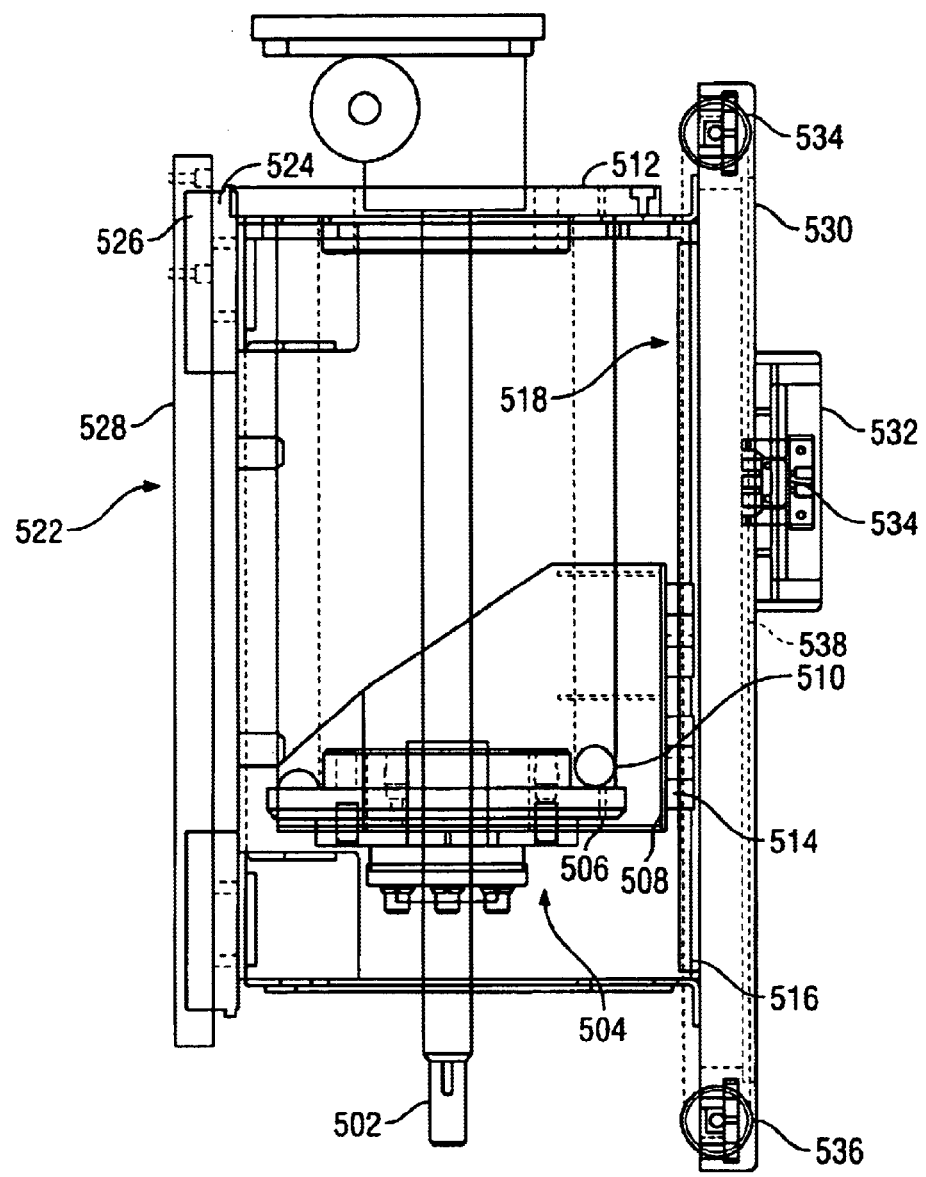
FIG. 5A is an elevation cross-sectional view of a carriage in accordance with one specific embodiment of the present invention.
Figure 5B:
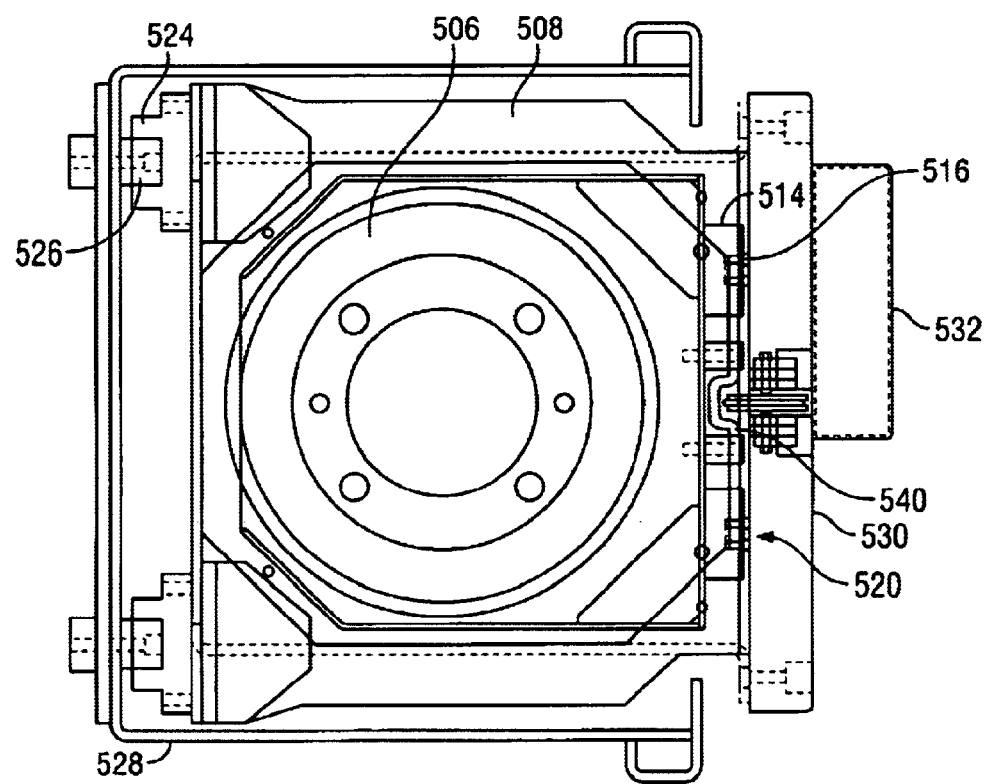
FIG. 5B is a top cross-sectional view of a carriage in accordance with one specific embodiment of the present invention.

FIG. 5A is an elevation cross-sectional view of a carriage in accordance with one specific embodiment of the present invention. FIG. 5B is a top elevation cross-sectional view of a carriage in accordance with one specific embodiment of the present invention. A vertical rotating screw 502 is engaged with a traveling nut 504. The traveling nut 504 may also comprise a plate 506 coupled an inner carriage 508. The base of the inner carriage 508 along with the plate 506 form a support on which spring 510 is disposed. FIG. 5A illustrates a coil shape spring having an axis aligned with the axis of the vertical rotating screw 502. The top of the spring 510 supports the ceiling of the outer carriage 512. The outer carriage 512 may be in the shape of a box enclosing the spring 510 and the inner carriage 508. The outer carriage 512 may be large enough to allow the inner carriage 508 to move up or down with the spring 510 compressed. The inner carriage 508 slides vertically along the inner walls of the outer carriage 512. A face of the inner carriage comprises several vertical guides 514 in engagement with vertical tracks 516 mounted on the inner face 518 of the outer carriage 512. Linear bearings 520 may be used to couple the inner carriage 508 to the outer carriage 512. One of ordinary skill in the art will recognize that there are other ways to couple the inner carriage 508 to the outer carriage 512 while allowing the inner carriage 508 to move up or down against the outer carriage 512.

A back side 522 of the outer carriage 512 comprises vertical guiding rails 524 in engagement with vertical tracks 526 mounted on a wall 528 of the column structure. Linear bearings 520 may be used to couple the outer carriage 512 to the wall 528. One of ordinary skill in the art will recognize that there are other ways to couple the outer carriage 512 to the wall 528 while allowing the outer carriage 512 to move up or down against the wall 528.

The outer face of the outer carriage 512 may comprise a module mounting plate 530 on which an arm for carrying a test head may be attached. The mounting plate 530 comprises a top pulley 534 and a bottom pulley 536 aligned along the same vertical axis.

In accordance with one specific embodiment of the present invention, a vertical force module 532 may be mounted on the mounting plate 530. A vertical force module 532 mounted on the mounting plate 530 senses the vertical drive force using the differential motion between the inner 508 and outer carriage 512. The measurement of the differential motion is transmitted out of the carriage by way of a cable 538 wrapped around both top pulley 534 and bottom pulley 536. A portion of the cable 538 may be attached to the inner carriage by way of a clamp 540 or other means. When the outer carriage 512 moves vertically with respect to the inner carriage 508, the cable 538 is pulled vertically. The vertical force module 532 may comprise an indicator (see FIGS. 6A, 6B, 6C) that is attached to the cable 538 opposite to the clamp 540 on the exterior face of the mounting plate 530.

Figure 6A:
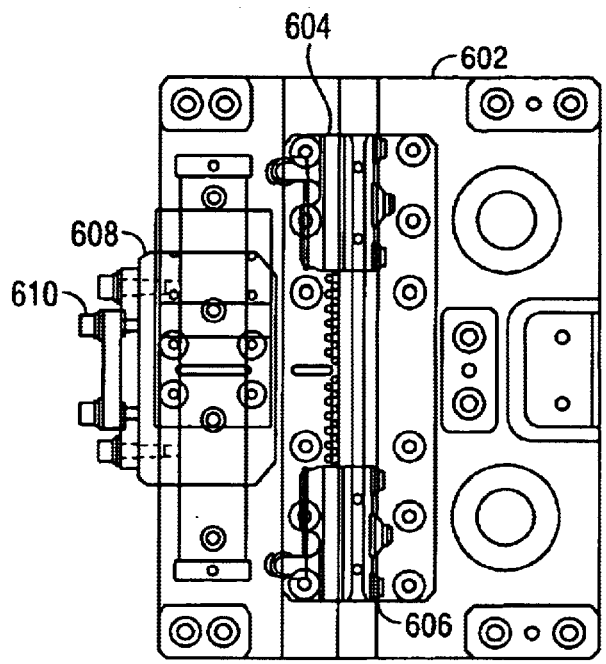
FIG. 6A is a frontal elevation view of a vertical force module in accordance with one specific embodiment of the present invention.
Figure 6B:
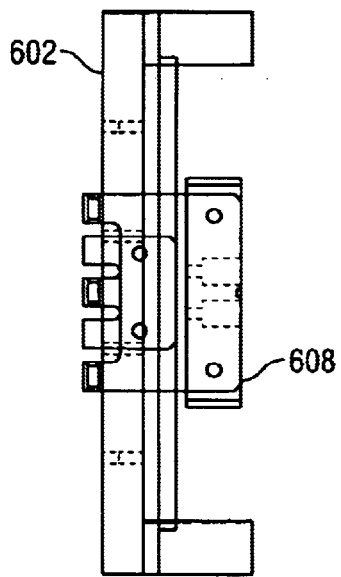
FIG. 6B is a side elevation cross-sectional view of a carriage in accordance with one specific embodiment of the present invention.
Figure 6C:
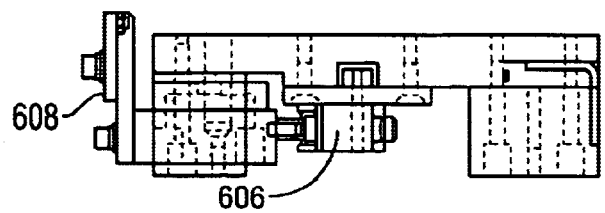
FIG. 6C is a top elevation cross-sectional view of a carriage in accordance with one specific embodiment of the present invention.

The vertical force module 532 itself can be set for different amounts of vertical force by changing the characteristics of the spring 510 that connects the inner carriage 508 to the outer carriage 512. The vertical force module 532 may also have a visual indicator 534 that corresponds to the driving force or load imbalance. FIGS. 6A, 6B, and 6C describe the vertical force module in more detail.

FIG. 6A is a frontal elevation view of a vertical force module in accordance with one specific embodiment of the present invention. FIG. 6B is a side elevation cross-sectional view of a carriage in accordance with one specific embodiment of the present invention. FIG. 6C is a top elevation cross-sectional view of a carriage in accordance with one specific embodiment of the present invention. The vertical force module may comprise a bracket 602 mounted on the mounting plate 530. The bracket 602 comprises an upper sensor 604 and a lower sensor 606. FIG. 6A illustrates sensors with a mechanical switch. One of ordinary skill in the art will recognize that many other ways to sensor type may be used, for example, such as optical sensors. Both upper and lower sensors 604 and 606 are aligned along the same vertical axis.

An indicator 608 is removably coupled to the bracket 602. One side of the indicator is aligned with the vertical axis of the sensors 604 and 606 such that the edges of the indicator contact either sensors when the indicator is moved vertically up or down within a specified range. Another side of the indicator 608 is coupled to the cable 538 in FIG. 5A through clamps 610. One of ordinary skill in the art will recognize that the indicator 608 may be attached to the cable 538 through other means.

For illustration purposes, the following describes in more detail the operation of the manipulator. A test head may have a load of 6000 lbs. The vertical drive system is able to raise, lower, and position the load within a specified vertical range, for example, 40 inches.

All powered operation of the drive system may be in the jogging mode under manual control. There may be two jogging speeds: fast and slow. The speeds may apply to both lifting and lowering the load. For example, an ideal fast speed may be 1.00 inch per second. An acceptable speed may be 0.50 inch per second. A slow speed may be 0.10 inch per second.

After the motor is switched off, the load comes to a stop within a specified drift distance. For example, a fast speed drift may be 0.20 inch, while a slow speed drift may be 0.02 inch.

The vertical drive system as illustrated in FIG. 6 is able to hold the load with the power off. No vibration is present in the manipulator system. A safety device, such as a thermal cutoff switch, may be required to prevent drive system damage under abnormal high cycle use.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A manipulator for a test head comprising:

a base;

a tower mounted on said base, said tower having vertical tracks;

a threaded vertical shaft mounted on said base adjacent to said tower;

an outer carriage in engagement with said vertical tracks, said carriage moveable relative to said tower along a vertical axis of said vertical tracks;

an inner carriage in engagement with said threaded vertical shaft, said inner carriage moveable relative to said tower along a vertical axis of said vertical shaft;

a spring disposed between said inner carriage and said outer carriage, said spring supporting said outer carriage; and an arm coupled to said outer carriage, said arm adapted for supporting the test head.

2. The manipulator of claim 1 further comprising:
a counterweight mounted on said base.

3. A manipulator for a test head comprising:
a base;
a tower mounted on said base, said tower having vertical tracks;
a vertical shaft mounted on said base adjacent to said tower;
an outer carriage in engagement with said vertical tracks, said carriage moveable relative to said tower along a vertical axis of said vertical tracks;
an inner carriage in engagement with said vertical shaft, said inner carriage moveable relative to said tower along a vertical axis of said vertical shaft;
a spring disposed between said inner carriage and said outer carriage, said spring supporting said outer carriage; and
an arm coupled to said outer carriage, said arm adapted for supporting the test head,
wherein said vertical shaft further comprises:
a jack screw with gear; and
a rotating screw coupled to said jack screw.

4. A manipulator for a test head comprising:
a base;
a tower mounted on said base, said tower having vertical tracks;
a vertical shaft mounted on said base adjacent to said tower;
an outer carriage in engagement with said vertical tracks, said carriage moveable relative to said tower alone a vertical axis of said vertical tracks;
an inner carriage in engagement with said vertical shaft, said inner carriage moveable relative to said tower along a vertical axis of said vertical shaft;
a spring disposed between said inner carriage and said outer carriage, said spring supporting said outer carriage;
an arm coupled to said outer carriage, said arm adapted for supporting the test head; and
a rotary bearing connected to said base and said tower, said tower rotating about a vertical axis.

5. A manipulator for a test head comprising:
a base;
a threaded vertical shaft mounted to said base;
a carriage in engagement with said threaded vertical shaft, said carriage moveable relative to said threaded vertical shaft along a vertical axis;
a horizontal member extending from said carriage, said horizontal member being movable relative to said base, said horizontal member adapted for supporting the test head; and
a counterweight mounted on said base.

6. The manipulator of claim 5 wherein said case further comprises:
an inner carriage coupled to said threaded vertical shaft;
an outer carriage supported by said inner carriage, said outer carriage coupled to said horizontal member; and
a spring disposed between said inner carriage and said outer carriage.

7. A manipulator for a test head comprising:
a base;
a vertical shaft mounted to said base;
a carriage coupled within said vertical shaft, said case moveable relative to said vertical shaft along a vertical axis;
a horizontal member extending from said case, said horizontal member being movable relative to said base, said horizontal member adapted for supporting the test head; and
a counterweight mounted on said base,
wherein said vertical shaft further comprises:
a jack screw with integral gear; and
a rotating screw coupled to said jack screw.

8. The manipulator of claim 5 further comprising:
a tower structure surrounding said threaded vertical shaft.

9. A manipulator for a test head comprising:
a base;
a vertical shaft mounted to said base;
a carriage coupled within said vertical shaft, said case moveable relative to said vertical shaft along a vertical axis;
a horizontal member extending from said case, said horizontal member being movable relative to said base, said horizontal member adapted for supporting the test head;
a counterweight mounted on said base;
a tower structure surrounding said vertical shaft; and
a rotary bearing connected to said base and said tower structure, said tower structure rotating about a vertical axis.

10. A manipulator for a test head comprising:
a base;
a tower mounted on said base, said tower having a threaded vertical shaft;
a carriage in engagement with said threaded vertical shaft within said tower and moveable relative to said tower along a vertical axis;
an arm coupled to said carriage, said arm adapted for supporting the test head; and
a compliant member disposed between said carriage and said horizontal arm.

11. The manipulator of claim 10 further comprising:
a counterweight mounted on said base.

12. The manipulator of claim 10 wherein said carriage further comprises:
an inner carriage coupled to said threaded vertical shaft within said tower;
an outer carriage supported by said inner carriage, said outer carriage coupled to said horizontal member; and
a spring disposed between said inner carriage and said outer carriage.

13. A manipulator for a test head comprising:
a base;
a tower mounted on said base;
a carriage in engagement within said tower and moveable relative to said tower along a vertical axis;
an arm coupled to said carriage, said arm adapted for supporting the test head;
a compliant member disposed between said carriage and said horizontal arm;

a jack screw with gear; and a rotating screw coupled to said jack screw.

14. A manipulator for a test head comprising:

a base;

a tower mounted on said base;

a carriage in engagement within said tower and moveable relative to said tower along a vertical axis;

an arm coupled to said carriage, said arm adapted for supporting the test head;

a compliant member disposed between said carriage and said horizontal arm; and a rotary bearing connected to said base and said tower, said tower rotating about a vertical axis.

15. A carriage comprising:

an outer carriage having one side in engagement with vertical tracks, said carriage moveable a vertical axis of said vertical tracks;

an inner carriage in engagement a threaded vertical shaft, said inner carriage moveable along a vertical axis of said threaded vertical shaft; and a spring disposed between said inner carriage and said outer carriage, said spring supporting said outer carriage.

16. The carriage of claim 15 further comprising:

an arm coupled to said outer carriage, said arm adapted for supporting a test head.

* * * * *

UNITED STATES PATENT AND TRADEMARK OFFICE
CERTIFICATE OF CORRECTION

PATENT NO. : 6,766,996 B1  Page 1 of 1
APPLICATION NO. : 10/197226
DATED : July 27, 2004
INVENTOR(S) : Somers It is certified that error appears in the above-identified patent and that said Letters Patent is hereby corrected as shown below:

On the title page item (56),

In column 2 line 18 replace "heads," with --head,--

In column 2 line 42 before outer carriage replace "an" with --and the--

In column 4 line 62 after and coupled insert --to--

In column 9 line 36 after relative to said tower replace "alone" with --along--

In column 12 line 3 after said carriage moveable insert --along--

In the references cited delete the "*" by patent 4,705,447

Signed and Sealed this

Thirteenth Day of May, 2008

JON W. DUDAS
*Director of the United States Patent and Trademark Office*